United States Patent
Mourey

(10) Patent No.: US 8,617,988 B2
(45) Date of Patent: Dec. 31, 2013

(54) THROUGH-SUBSTRATE VIAS

(75) Inventor: Devin Alexander Mourey, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 137 days.

(21) Appl. No.: 13/154,051

(22) Filed: Jun. 6, 2011

(65) Prior Publication Data

US 2012/0309135 A1    Dec. 6, 2012

(51) Int. Cl.
*H01L 21/44* (2006.01)
(52) U.S. Cl.
USPC ............... 438/667; 216/17; 257/E21.159
(58) Field of Classification Search
USPC ................................. 438/667; 216/17, 18
See application file for complete search history.

(56) References Cited

U.S. PATENT DOCUMENTS

| | | | |
|---|---|---|---|
| 6,620,731 B1 * | 9/2003 | Farnworth et al. | 438/667 |
| 7,419,611 B2 * | 9/2008 | DiPietro et al. | 216/54 |
| 7,531,445 B2 * | 5/2009 | Shiv | 438/620 |
| 7,585,424 B2 | 9/2009 | Mei et al. | |
| 7,829,462 B2 | 11/2010 | DeNatale et al. | |
| 2009/0051039 A1 | 2/2009 | Kuo et al. | |
| 2009/0315154 A1 | 12/2009 | Kirby et al. | |

OTHER PUBLICATIONS

E. Lausecker, et al.; "Self-aligned Imprint Lithography for Top-gate Amorphous Silicon Thin-film Transistor Fabrication"; Applied Physics Letters; Jun. 28, 2010; vol. 96; American Institute of Physics; http://www.princeton.edu/~sturmlab/pdfs/publications/JP.182.pdf.

* cited by examiner

*Primary Examiner* — Charles Garber
*Assistant Examiner* — Reema Patel

(57) ABSTRACT

A method of etching through-substrate vias comprising depositing a layer of embossable material on a first side and a second side of a thin-film stack, the thin-film stack including a base substrate, embossing the embossable material deposited on the first side and the second side of the thin-film stack with a pattern, hardening the embossable material, and etching the first and second sides of the thin-film stack, the etching of the second side of the thin-film stack forming vias through the base substrate.

9 Claims, 8 Drawing Sheets

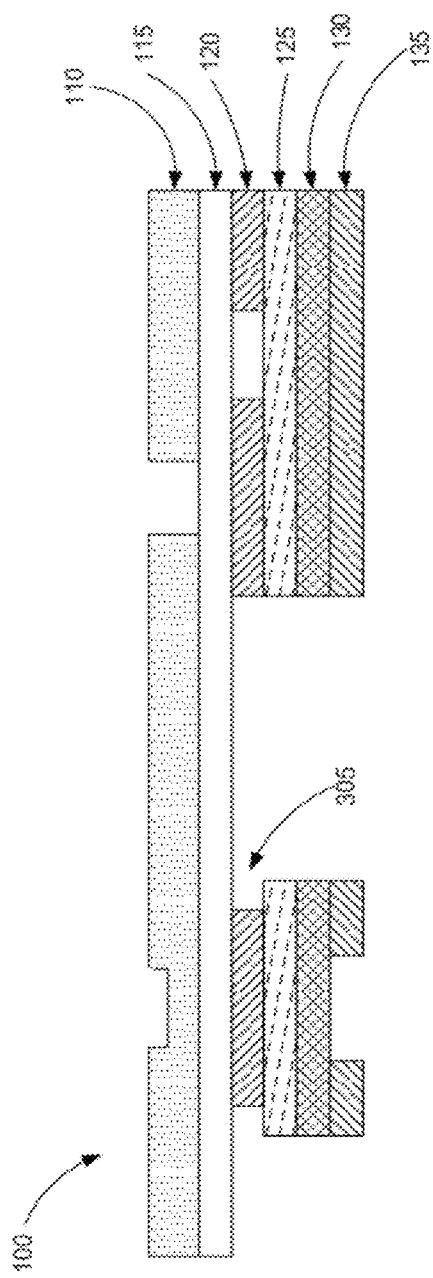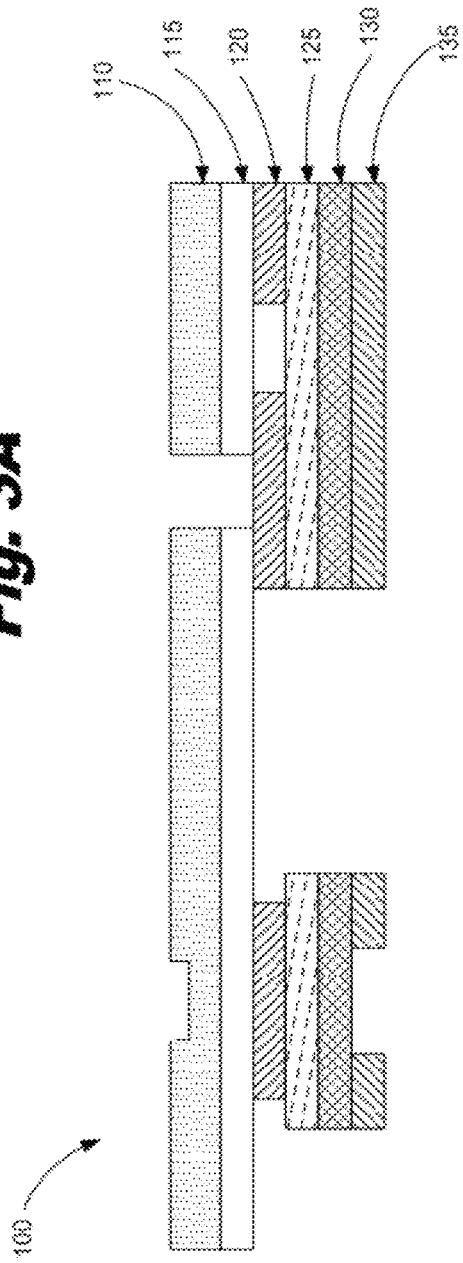

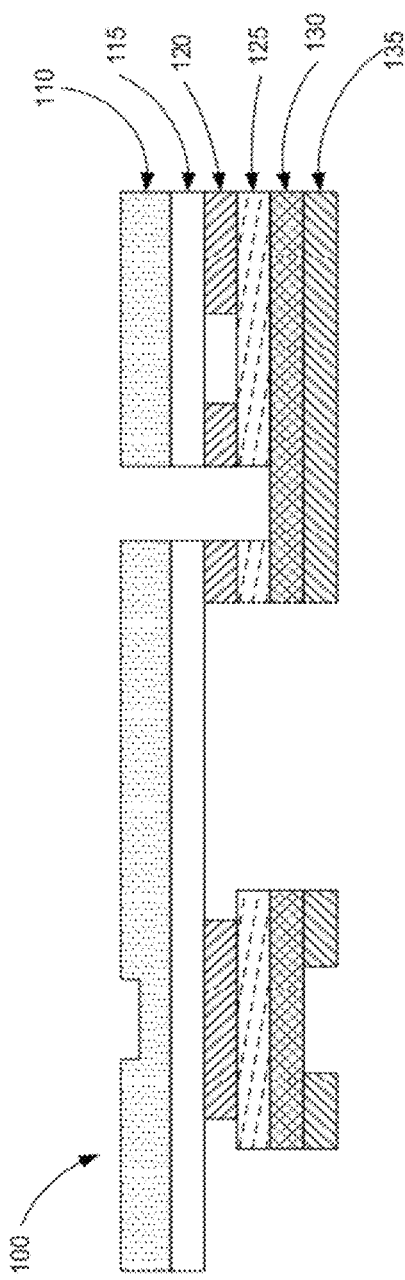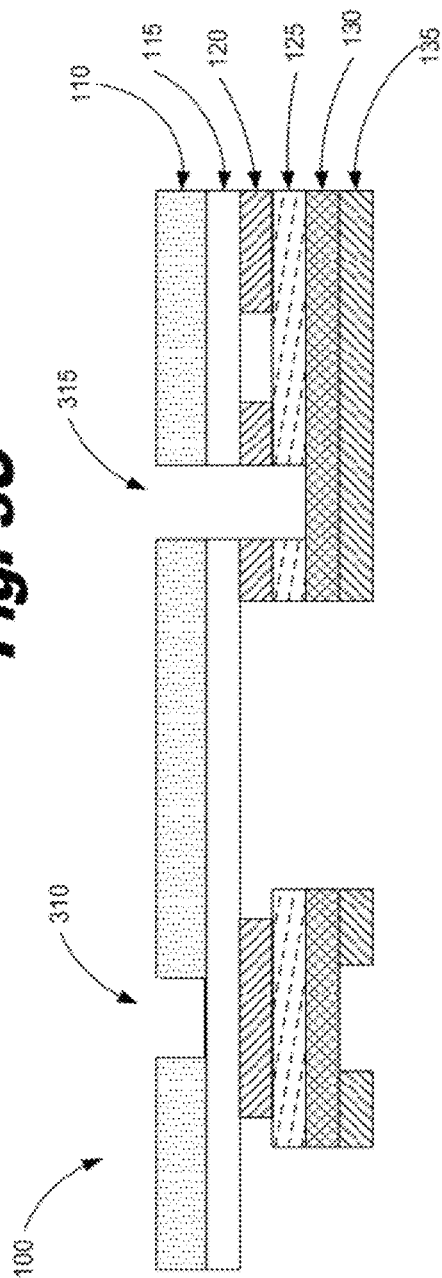

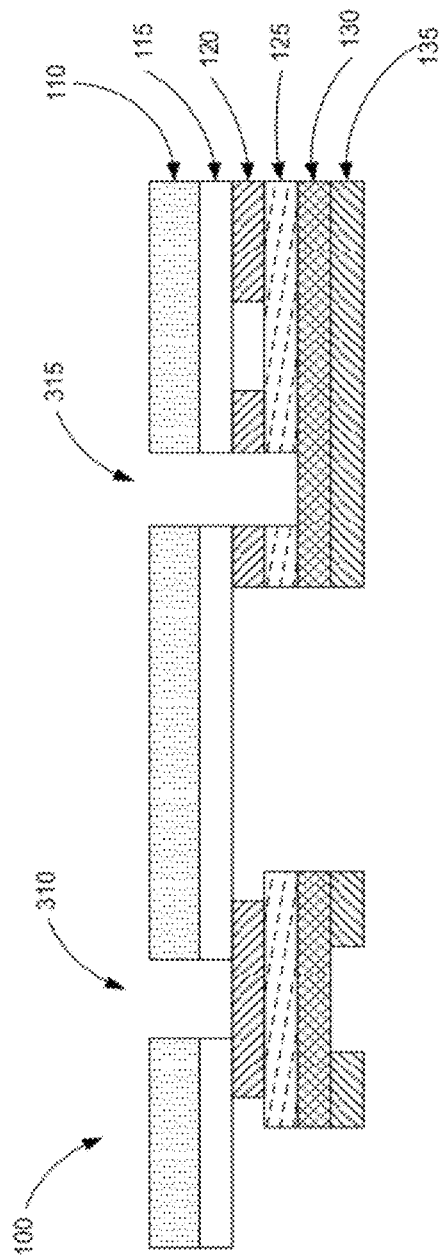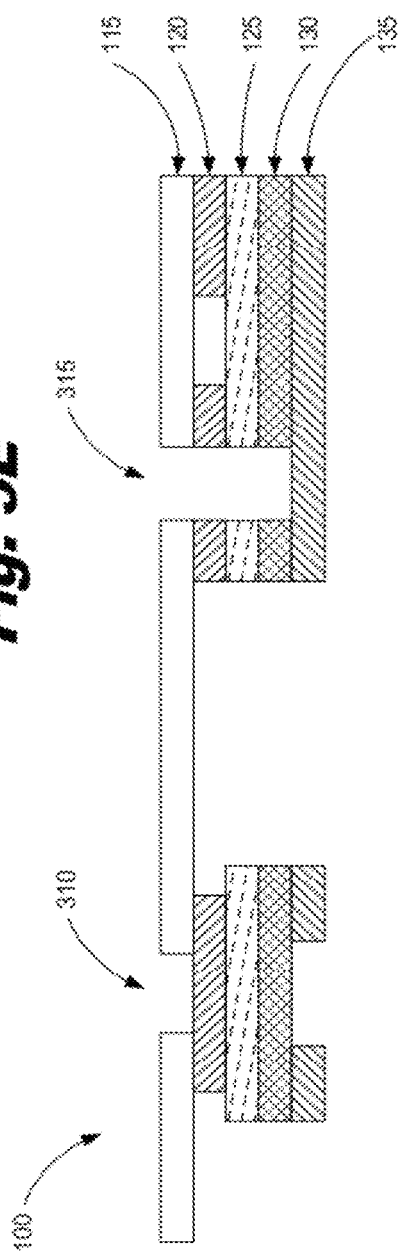

THROUGH-SUBSTRATE VIAS

BACKGROUND

Self-aligned imprint lithography (SAIL) is one method of forming electronic components and circuit elements. For example, SAIL can be used to form thin-film transistors on a flexible substrate.

In such cases, the flexible substrate is coated using a roll-to-roll process with a number of stacked thin-film layers that will form the transistors. An etchable masking structure is formed over the thin-film stack. A pattern corresponding to the transistor components needed is impressed into the masking structure, creating variations in the height of the masking structure. The result is then etched. Compressed portions of the masking structure will be etched away more quickly resulting in a deeper further etching of the underlying thin-film stack. In this way, the pattern impressed into the masking structure is transferred to the stacked thin-film layers. Consequently, alignment is maintained whether or not process-induced distortions exist.

Some of the layers in the thin-film stack provide electrical connections between transistor components and are, therefore, conductive. However, because the patterning is imprinted into the stack using a single three-dimensional masking structure, it can be an issue to electrically connect different levels and portions of the conductive layers together from the surface of the substrate to form the transistor or other circuit element being made.

BRIEF DESCRIPTION OF THE DRAWINGS

The accompanying drawings illustrate various examples of the principles described herein and are a part of the specification. The illustrated examples do not limit the scope of the claims.

FIG. 3A-3G shows a process of etching the back side of a thin-film stack is shown according to one example of the principles described herein

Throughout the drawings, identical reference numbers designate similar, but not necessarily identical, elements.

DETAILED DESCRIPTION

Figure 1:
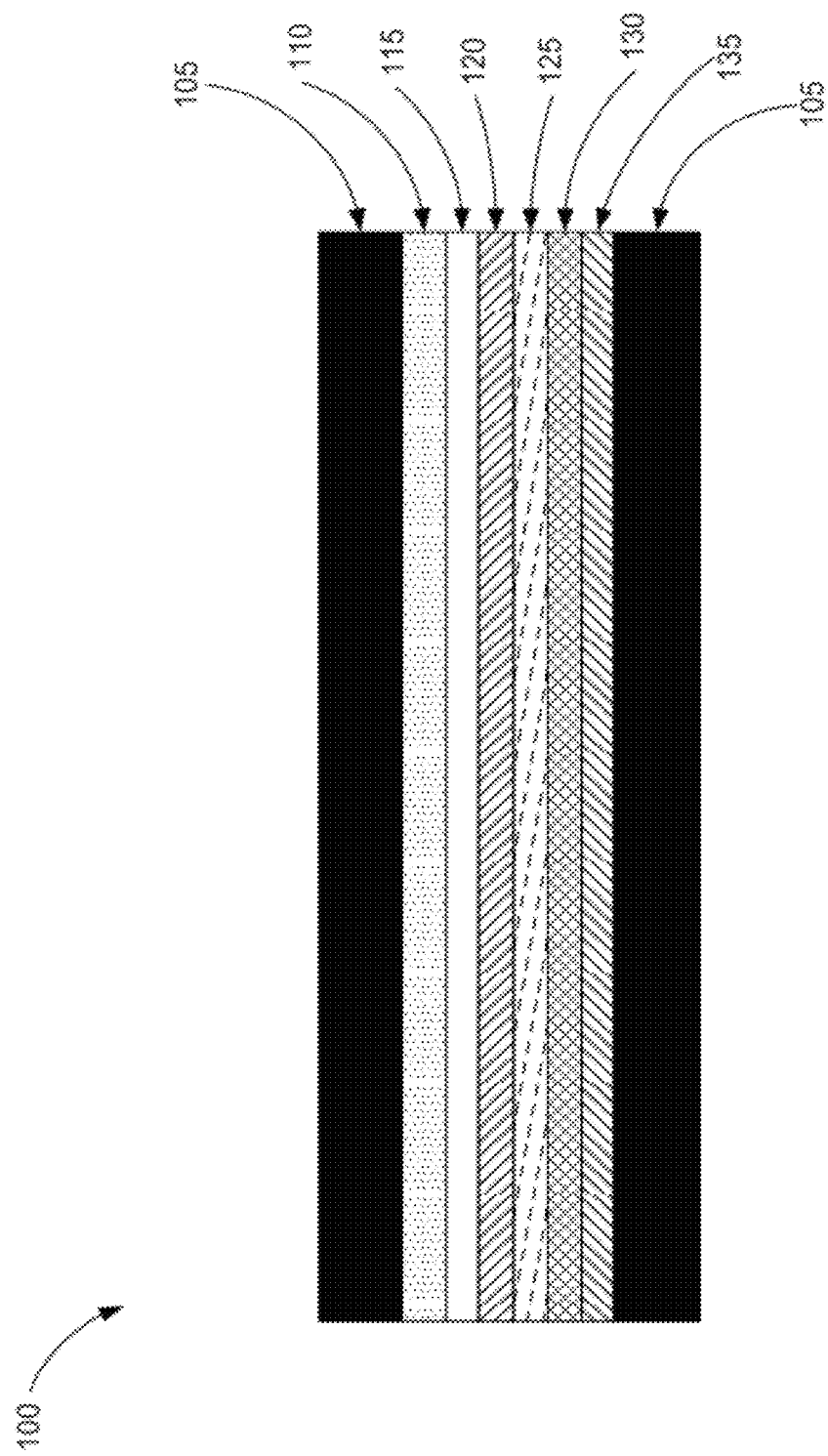
FIG. 1 is a cross-sectional diagram of a thin-film stack according to one example of the principles described herein.

As discussed above, self-aligned imprint lithography (SAIL) can be used to create circuit elements, such as thin-film transistors. Transistors are composed of three basic components known as a source, gate and drain that must have some electrical interconnections. Given the SAIL method, it may be difficult to form such connections between a gate layer and a source and drain layer within a thin-film stack due to the three-dimensional nature of the structure. This may be true for other types of circuit element being formed using SAIL where electrical connections are needed between components.

Specifically, during the etching process, various features of the thin-film transistors may be electronically isolated by undercutting. However, these undercut layers may need to be accessed and, as mentioned, electrically connected to other layers within the thin-film stack to form the transistor. The ability to connect these different layers is limited from the front side of the thin-film stack because of the isolated nature of these layers.

Consequently, the present specification describes a process in which, while the circuit elements are being formed by SAIL on a first side of a substrate, vias are formed through the substrate and into the structure from the opposite side of the substrate so that electrical connections between elements of the device or circuit being formed can be made.

In some examples, the present specification describes a process in which a hard mask layer is formed on the back side of the substrate supporting the thin-film stack. The hard mask layer is then etched so that vias may be created through the substrate layer and into the various layers of the thin-film stack. Once those vias have been created, a type of metal or other conducive material may be deposited on the back side of the thin-film stack to electrically connect the various elements in the thin-film stack to which the vias were formed.

In some examples, the hard mask layer is formed on both the front side and back side of the thin-film stack simultaneously. This eliminates alignment errors as well as balancing any film stress that may occur during processing.

After the hard mask layer is formed, one or both sides of the substrate and thin-film stack may receive an embossable coating. The coating may then be embossed or molded with a pattern and then cured so that the pattern remains. The thin-film stack is then etched such that the pattern is developed into the thin-film stack resulting in the front side of the thin-film stack having the desired thin-film features of the transistors being formed and the back side having a number of vias that connect various layers of the thin-film stack to other layers within that thin-film stack.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

FIG. 1 is a cross-sectional diagram of a thin-film stack (100) according to one example of the principles described herein. Although the present example shows a thin-film stack comprising six layers, it should be understood that more or fewer layers may be present as best suits a particular application. In the example of FIG. 1, the thin-film stack (100) includes an embossable layer (105) on both sides of the thin-film stack (100), a hard mask layer (110) on the back side of the thin-film stack (100), a base substrate layer (115), a gate layer (120), a dielectric layer (125), a semiconductor layer (130), and a source and drain layer (135). The gate layer and the source and drain layer may be conductive layers. These layers will now be described in more detail.

The embossable layer (105) may be any layer that is capable of receiving an embossed pattern and subsequently, through an etching process, transfer that pattern onto a portion of the thin-film stack (100). In one example, the embossable layer (105) may be a resin that is cured by ultraviolet light or other radiation. In another example, the embossable layer (105) may be a resin that is cured by the application of heat.

After the embossable layer (105) has been cured, etching is performed to transfer the embossed pattern into the thin-film stack (100).

As will be discussed later, the embossable layer (105) may be etched multiple times to created the various three-dimensional features on the front side of the thin-film stack (100) that are used to form transistors. Additionally, with the embossable layer (105) disposed on both the front and back sides of the thin-film stack (100), the three-dimensional features of the thin-film stack (100) may be etched on the front side while, simultaneously, a number of vias are created through the substrate and other layers of the thin-film stack (100) from the back side. Then, a conductive or metallic layer may be deposited on at least portions of the back side of the thin-film stack (100) to provide electrical connections between the various layers within the thin-film stack (100) that are inaccessible from the front side of the thin-film stack (100).

The hard mask layer (110) may be made, for example, from $SiO_2$. In some cases, the material used for the embossable layer (105) may be etched away relatively more rapidly than the materials used for the hard mask layer (110) if a certain type of etching process is used such as dry etching or plasma etching. In these cases, the hard mask layer (110) resists the etching that removes the embossable layer (105). Consequently, after the embossable layer (105) is removed, the hard mask layer (110) can be etched using a different etching process, for example, a $CF_4/O_2$ plasma etching process. Therefore, in one example, the pattern embossed in the embossable layer (105) may serve to provide a pattern on the hard mask layer (110). The hard mask layer (110) may then be etched away using, for example, the $CF_4/O_2$ plasma etching process to create the vias mentioned above.

In another example, the hard mask layer (110) may not be present and the embossable layer (105) may be embossed and etched as described above thereby transferring the embossed pattern into the substrate layer (115) using a transitional layer to transfer the embossed pattern onto the substrate layer (115). This process may be beneficial if both the embossable layer (105) and the substrate layer (115) are etched away at or around the same rate. In yet another example, the embossable layer (105) may not be present and the hard mask layer (110), after embossing and etching, may be used to transfer the three-dimensional pattern to the thin-film stack (100).

The substrate layer (115) may be made of plastic, flexible glass, or other materials suitable for supporting the other layers in the thin-film stack (100). After the etching process, the substrate layer (115) may form the base on which the three-dimensional features of the thin-film stack (100) will be supported. In one example, the substrate layer (115) may be etched through to create the vias through which the various layers of the thin-film stack (100) may be electrically connected.

As previously discussed, the various layers in the thin-film stack (100) may be used to form, for example, a transistor comprising gate, source, and drain terminals. The gate layer (120) of the thin-film stack (100) may therefore serve as the gate terminal in a transistor and may be a first layer of conductive material within the thin-film stack (100). As will be discussed, the etching process on the back of the thin-film stack (100) may produce a number of vias through which the gate layer (120) may be electrically connected to the source and drain layer (135) serving as a second conductive layer in the thin-film stack (100).

As mentioned above, although the present example is the creation of a transistor within the thin-film stack (100) comprising a first and second layer of conductive material (120, 135) separated by a semiconductive material (130), the principles described herein may also be used to create other types of circuits and circuit elements. Examples of other circuit elements may include, but are not limited to, resistors, capacitors, and other semiconductor devices. More generally, the present process may be used to create any device that requires various conductive layers in a thin-film stack (100) to be electrically connected.

The dielectric layer (125) may be any type of insulator sufficient to electrically separate the gate layer (120) from the semiconductor layer (130) and source and drain layer (135). In this manner, as discussed above, the present process may further be implemented to create a capacitor circuit as well as the transistor circuit that will be described in connection with FIGS. 2-3G.

The semiconductor layer (130) may comprise a p-type or n-type semiconductor with varying levels of impurities within the semiconductor material so as to control the number of charge carriers within the semiconductor. In one example, the semiconductor layer (130) may be layered in such a way so as to provide the appropriate p-n junction between the semiconductor layer (130) and source and drain layer (135). In another example, the semiconductor layer (130) may be layered in such as way as to provide the appropriate p-n-p or n-p-n junctions between the semiconductor layer (130) and source and drain layer (135).

The source and drain layer (135) may be made of similar material as that of the gate layer (120). As previously discussed, the thin-film stack (100) may be used, in one example, to create a transistor circuit within the thin-film stack (100). However, the principles described herein may also be used to create other types of circuits. In the present example, however, the source and drain layer (135) may be used, along with the gate layer (120), to form the transistor circuit. Therefore both layers may be made of an electrically conductive material.

Figure 2:
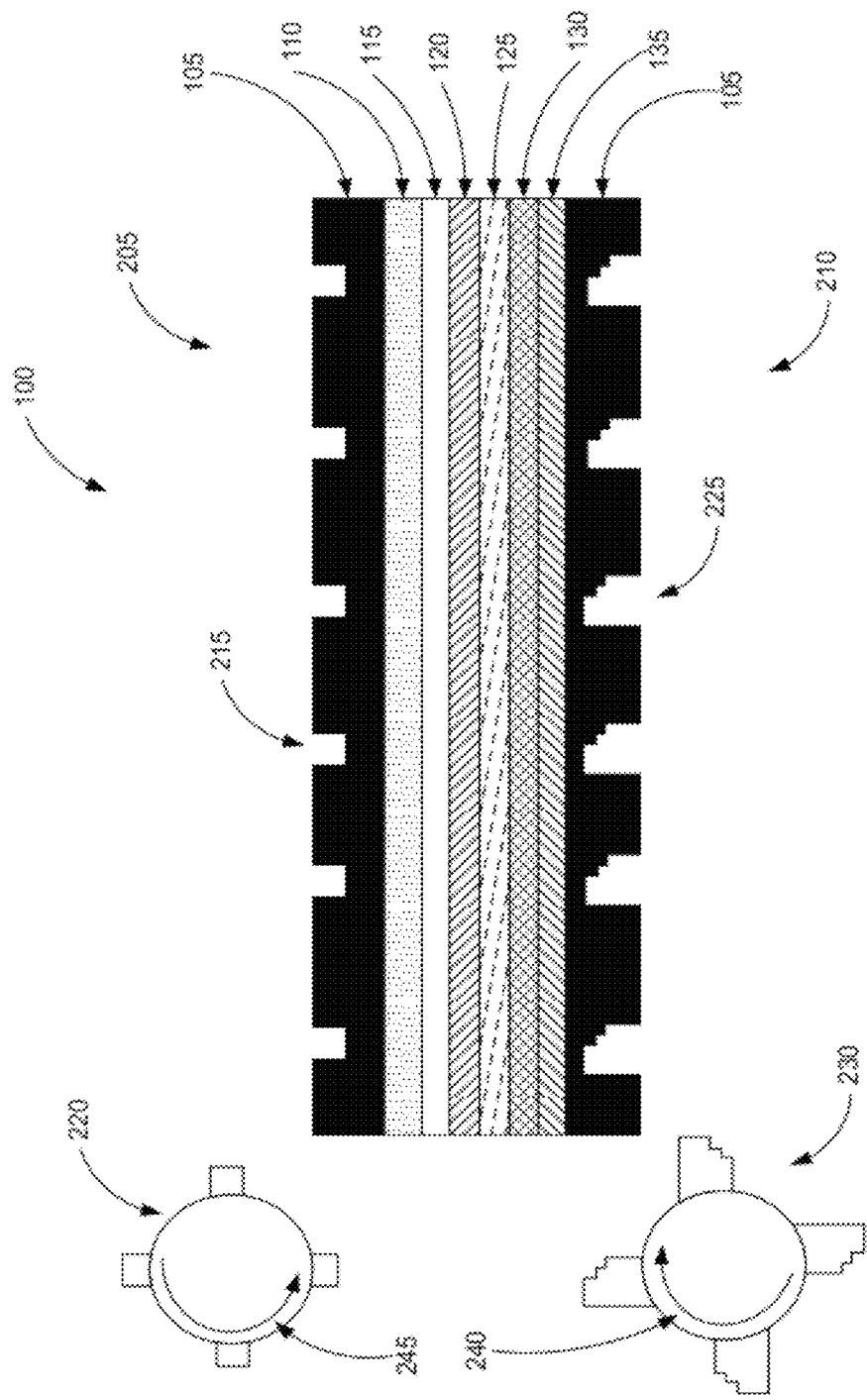
FIG. 2 is a cross-sectional diagram of a thin-film stack being embossed according to one example of the principles described herein.
Figure 3G:
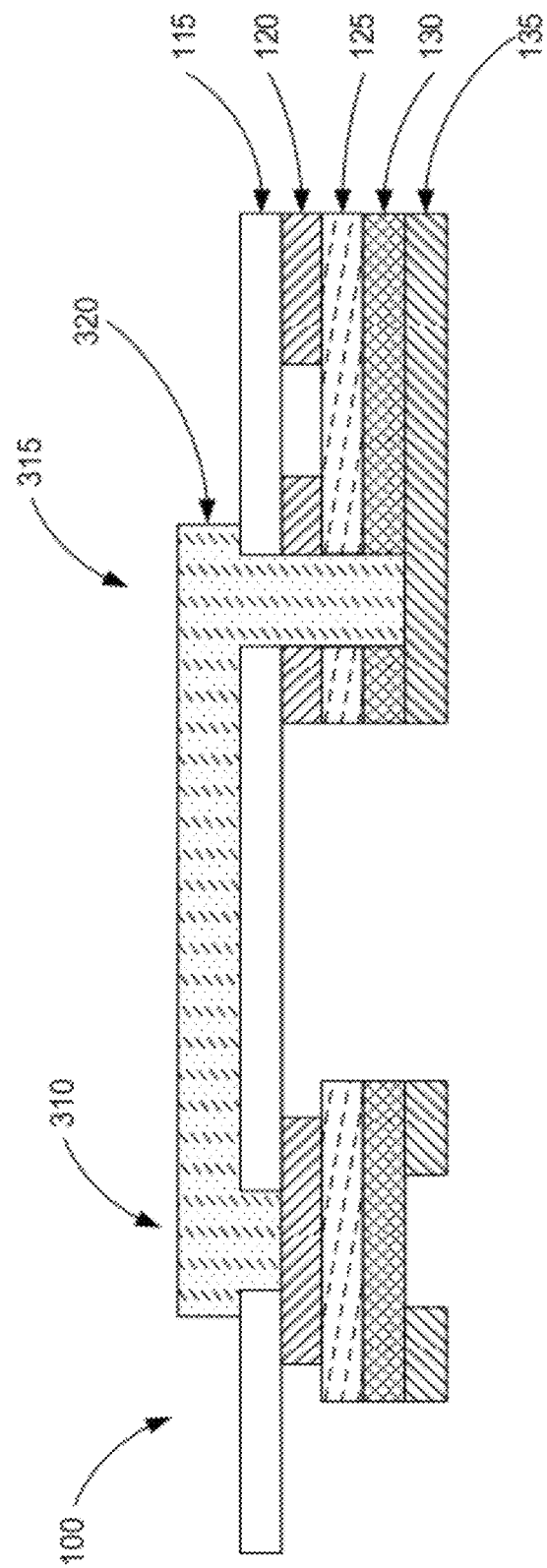

Turning now to FIG. 2, a cross-sectional diagram of a thin-film stack (100) being embossed is shown according to one example of the principles described herein. As mentioned earlier, the process of self-aligned imprint lithography may be used in etching the back side (205) of the thin-film stack (100) to create vias through the thin-film stack (100). Again, it may be difficult to access various layers within the thin-film stack (100) after the front side (210) of the thin-film stack (100) has been etched. In order to be able to access these layers, vias may be created through the back side (205) of the thin-film stack (100) and a layer of conductive material may be layered on the back side (205) so as to electrically connect the various layers together.

During the embossing of the thin-film stack (100) the embossable layer (105) may be embossed by a number of embossing tools (220, 230). In the example shown in FIG. 2, the front side (210) of the thin-film stack (100) may be embossed in such a way so as to create the various three-dimensional features of the thin-film stack (100) needed to form the target circuit elements, such as thin-film transistors.

Specifically, the front side embossing tool (230) may create a number of stepped features (225) within the embossable layer (105) so that, through a number of etching processes, the stepped features will be etched into the various levels of the thin-film stack (100) thereby creating multilevel features in the thin-film stack (100). These features may serve various functions, one example of which may be to create the topside portions of a transistor.

By using this etching process, various layers may be undercut such that they may be electrically isolated from the rest of the layers within the thin-film stack (100). In one example, the gate layer (120) may be undercut, thereby assuring that the gate layer (120) and the source and drain layer (135) are electrically isolated from each other.

During embossing of the front side (210) of the thin-film stack (100), the back side (205) may also be embossed by a back side embossing tool (220). As discussed earlier, the embossable layer (105) on the back side (205) of the thin-film stack (100) may be embossed with features (215) that will provide etched vias through the thin-film stack (100) after the back side (205) has been subjected to a number of etching processes. Additionally, in one example, the embossable layer (105) may be etched along with a hard mask layer (110) so as to appropriately etch the vias through the thin-film stack (100). In another example, the pattern may be embossed directly into the hard mask layer (110) and the hard mask layer (110) may be etched in such a way so that the vias are created from the back side (205) of the thin-film stack (100). In yet another example, the embossable layer (105) on the back side of the thin-film stack (100) may be the sole layer that transfers the embossed features (215) into the thin-film stack (100). The configuration of layers used will depend on how deeply the various vias need to penetrate into the thin-film stack.

In one example, the front side (210) and back side (205) of the thin-film stack (100) may be simultaneously embossed and etched. As indicated by the arrows (240, 245) the embossing tools (230, 220) may rotate in opposite directions to allow the thin-film stack (100) to be sent in between them. Thereby both the front side (210) and back side (205) of the thin-film stack (100) may be embossed simultaneously.

One advantage of simultaneously embossing and etching the front (210) and back sides (210) may be the minimization of alignment errors. Additionally, this process may not affect the interaction of the final layer passivation process of the thin-film stack (100) with the patternability of that layer.

Without vias created through the substrate from the back side (205) of the thin-film stack (100), a thick passivation layer may instead be needed. However, due to the reentrant or undercut profiles present in the structure and the overall thin-film stack (100) thickness, a relatively thick passivation layer would be needed to electrically connect the gate layer (120) to the source and drain layer (135). The thicker a passivation layer gets, the more stress is added to the thin-film stack (100) during the embossing and etching processes. Still further, the relatively thicker passivation layer, if not aligned properly, would result in a transistor with misaligned features that, may not work properly after embossing and etching.

Therefore an embossing device may consist of two embossing tools (220, 230) that rotate counter to each other and that receive a thin-film stack (FIG. 1, 100) in between them. As the thin-film stack (FIG. 1, 100) is brought in contact with the two embossing tools (220, 230) it is sandwiched in between them, and the embossing patterns are transferred into the embossable material of the embossable layers (105, 110). This allows through-substrate vias to be created in such a way so that the vias etched on the back side of the thin-film stack (100) may be properly aligned with the three-dimensional features etched into the front side of the thin-film stack (FIG. 1, 100).

In another example, the front side (210) and back side (205) of the thin-film stack (100) may be embossed and etched at different times. When the front side (210) and back side (205) of the thin-film stack (100) are embossed and etched at different times, the process still enables electrical connections to be made to the various layers without reentrant profiles. The process also provides for wider alignment tolerances and reduced parasitic capacitance. In this example, wider alignment tolerances are greater because misalignment results in an extension of the gate dimension thereby only slightly impacting parasitic capacitance.

FIG. 2 also shows a curing station (190) at which the embossed layers can be cured as described herein. FIG. 2 also shows a etching station (191) where the various different etching processes described herein can be performed.

Turning now to FIGS. 3A through 3G, a process of etching the back side (FIG. 2, 205) of a thin-film stack (100) is shown according to one example of the principles described herein. FIGS. 3A through 3G depict the front side (FIG. 2, 210) of the thin-film stack (100) after having undergone the etching process and the three-dimensional features of the thin-film stack (100) have been created. However, as discussed above in connection with FIGS. 1 and 2, the etching of the front side (FIG. 2, 210) and the back side (FIG. 2, 205) may be done simultaneously.

In another example, a number of layers may be etched from the front side (FIG. 2, 205) of the thin-film stack (FIG. 1, 100) along with a number of layers on the back side (FIG. 2, 210) of the thin-film stack (FIG. 2, 100). This may be accomplished in a single etching step or in multiple steps and may involve etching any number of layers on either the back (FIG. 2, 205) or front side (FIG. 2, 210) of the thin-film stack (100) during the etching processes.

During the etching process of the back side of the thin-film stack (100) shown in FIG. 3A, the hard mask layer (110), through a first etching process, has received the pattern embossed into the embossable layer (FIG. 2, 105) and the thin-film stack (FIG. 2, 100) is ready to be etched further. As discussed briefly above, the embossable layer (FIG. 2, 105), after being embossed, may be hardened by a hardening process. The hardening process may allow the three-dimensional features embossed into the embossable layer (FIG. 2, 105) to appropriately transfer the pattern into the hard mask layer (110). As a result of the first etching process, the entire embossable layer (FIG. 2, 105) may have been etched away leaving the pattern once embossed into the embossable layer (105) now embossed into the hard mask layer (110). As will be discussed, the pattern on the hard mask layer (110) may transfer the features etched into the hard mask layer (110) by the first etching process to the rest of the thin-film stack (100) layers.

In another example, however, the etching process shown in FIGS. 3A-3G may begin with the hard mask layer (110) being embossed with an embossing tool (FIG. 2, 220). Consequently, the embossable layer (FIG. 2, 105) may not be present and the hard mask layer (110) instead may receive the initial pattern that will be transferred to the thin-film stack (100).

Through the etching process of the back side (FIG. 2, 205) of the thin film stack (100), various vias may be created. The vias created allow the various layers to be accessed that would not have been accessible otherwise from the front side (FIG. 2, 210) of the thin-film stack (100). Specifically, various layers that have been isolated by the etching process conducted on the front side of the thin-film stack may be accessed. In the example shown in FIGS. 3A-3G an undercut region (305) is shown that is isolating a portion of the gate layer (120). As will be described later, in this example the gate layer (120) may be accessed and electrically connected to the source and drain layer (135) by a number of vias etched through the thin-film stack (100).

FIG. 3B shows the thin-film stack (100) after a second etching of the back side (FIG. 2, 205) has been performed. As is shown, the second etching process has etched through the substrate layer (115). Additionally, the etching process may have further deepened a number of other etches in the thin-film stack (100) that were not etched as deeply as other etches made in the first etching process. Through this process, various levels of etches are made such that the various layers in the thin-film stack (100) are made accessible by various stages of the etching process.

The etching of the layers of the thin-film stack (100) may be done by any number of processes. In one example, the layers may be etched using a $CF_4/O_2$ plasma etching process. In this example, a portion of the thin-film stack (100) is exposed to an oxygen plasma thereby selectively etching away some of the layers' materials. In another example, the layers may be etched using a wet etching process that may involve selectively etching the layers of the thin-film stack (100) with an acid while using a non-reactive mask to protect or prevent various portions of the thin-film stack (100) from being etched. In this example, etch depth may be controlled by the duration that the thin-film stack (100) is placed in the etching material or acid.

FIG. 3C shows the thin-film stack (100) after a third etching process. As is shown, the third etching process has etched through the gate layer (120) and the dielectric layer (125). During the various etching processes, a number of layers of the thin-film stack (100) may be etched up to a certain point so as to progress through the entire etching process in a controlled manner. Specifically, in FIG. 3C, etching to the semiconductor layer (130) provides an etch stop whereby other etching vias may be etched in a subsequent etching process so that the layers may be etched in a controlled manner.

FIG. 3D shows the thin-film stack (100) after a fourth etching process. As is shown, the fourth etching process may allow other portions of the hard mask layer (110) to be etched away. Specifically, in FIG. 3D, a gate access via (310) may continue to be created by etching the remainder of a portion of the hard mask layer (110) revealing the substrate layer (115) underneath. Still further, a source and drain access via (315) may continue to be formed as well with only the semiconductor layer (130) to be etched away. The source and drain access via (315), once completed, may provide access from the back side of the thin-film stack (100) to the source and drain layer (135).

FIG. 3E shows the thin-film stack (100) after a fifth etching process. As is shown, the fifth etching process has further deepened the gate access via (310) to the gate layer (120).

FIG. 3F shows the thin-film stack (100) after a sixth etching process. The sixth etching process may remove the remaining portions of hard mask layer (110) revealing the substrate layer (115) as well as the number of vias (310, 315) created during the previous etching processes.

Once the back side vias (310, 315) have been created, a metallic layer (320) may be formed on the back side (FIG. 2, 205) of the thin-film stack (100) at selective locations to connect, for example, the gate layer (120) to the source and drain layer (135).

As discussed earlier, the etching processes shown in FIGS. 3A-3G illustrate the process of creating a transistor within a thin-film stack (100). However, the process may be used to create any other electrical circuit and is not necessarily limited to creating a transistor. The present process may extend equally to any circuit design in which various layers of the thin-film stack (100) may need to be electrically connected.

Figure 4:
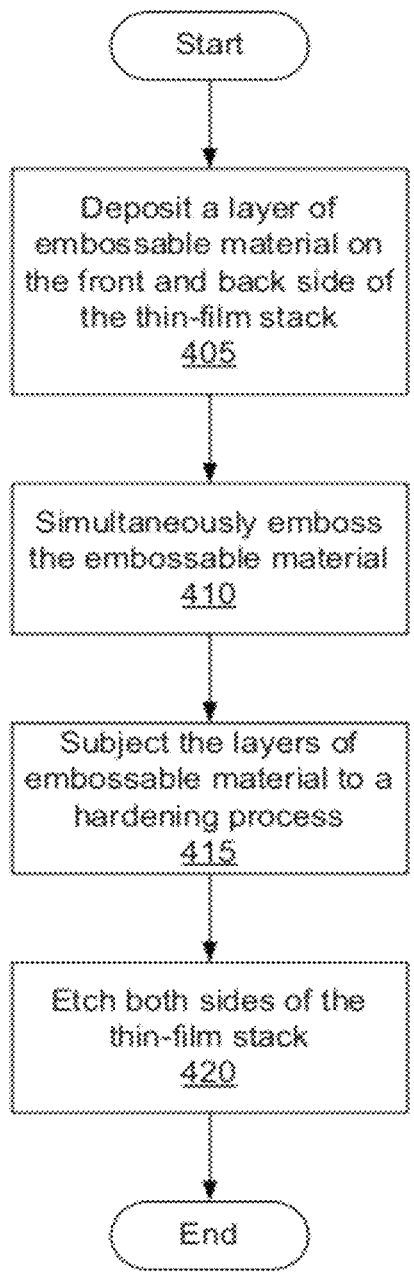
FIG. 4 is a flowchart describing a method of etching and embossing a thin-film stack according to one example of the principles described herein.

Turning now to FIG. 4, a flowchart is shown describing a method of etching and embossing a thin-film stack (FIG. 2, 100) according to one example of the principles described herein. The process may begin with an embossable layer (FIG. 1, 105, 110) being deposited (Block 405) on both the front side (FIG. 2, 210) and back side (FIG. 2, 205) of a thin-film stack (100). The deposition (Block 405) of the embossable layers (FIG. 1, 105, 110) may be done either simultaneously or at different times in the process. Additionally, as described above, any number of embossable layers may be deposited on either side of the thin-film stack (FIG. 1, 100). In one example, an embossing resin may be used for the embossable layer (FIG. 1, 105) and may be layered on the front side (FIG. 2, 210) of the thin-film stack (FIG. 1, 100) while another embossing resin may be deposited over a hard mask layer (FIG. 1, 110) that has already been deposited over the back side (FIG. 2, 205) of the thin-film stack (FIG. 1, 100).

In another example, an embossable layer (FIG. 1, 105) may be deposited (Block 405) on both sides of the thin-film stack (FIG. 1, 100) without a hard mask layer (FIG. 1, 110) first being deposited on the back side (FIG. 2, 205) of the thin-film stack (FIG. 1, 100). In this example, as well as in the previous example, the amount of embossing material used for the embossable layers (FIG. 1, 105, 110) may be reduced or increased so as to balance the amount of embossable material on both sides (FIG. 2, 205, 210) of the thin-film stack (FIG. 1, 100) more or less equally. In doing so, the stresses placed on the thin-film stack (FIG. 1, 100) will be reduced while the thin-film stack (100) is sent through the various rolls during processing.

The embossable layers (FIG. 2, 105, 110) may then be embossed (Block 410) with a number of embossing tools (FIG. 2, 220, 230). The embossing tools (FIG. 2, 220, 230) may transfer a pattern on either side (FIG. 2, 205, 210) of the thin-film stack (FIG. 1, 100). The patterns will be used later in the process to etch the thin-film stack (FIG. 1, 100) in such a way so as to properly form the various three-dimensional features on the front side (FIG. 2, 210) of the thin-film stack (FIG. 1, 100) as well as the vias through the back side (FIG. 2, 205) of the thin-film stack (FIG. 1, 100).

The embossable layers (FIG. 2, 105, 110) may then be subjected to a hardening process (Block 415) so that the embossable material is cured or at least semi-permanently solidified. As described above this may be done by, for example, subjecting the embossable layer (FIG. 1, 105, 110) to ultraviolet light or other radiation or subjecting the embossable layer (FIG. 1, 105, 110) to an amount of heat.

The thin-film stack (FIG. 1, 100) may then be subjected to an etching process (Block 420). In one example, the etching (Block 420) of the front side (FIG. 2, 210) and back side (FIG. 2, 205) of the thin-film stack (FIG. 1, 100) may be done simultaneously. In another example, the etching (Block 420) of the front side (FIG. 2, 210) and back side (FIG. 2, 205) of the thin-film stack (FIG. 1, 100) may be done a different stages in the process.

Various different types of etching processes may be used to simultaneously etch (Block 420) the various three-dimensional features on the front side (FIG. 2, 210) of the thin-film stack (FIG. 1, 100) and the vias through the back side (FIG. 2, 205) of the thin-film stack (FIG. 1, 100). The method of etching may include, for example, $CF_4/O_2$ plasma etching and wet etching.

In another example, embossing (Block 410) and etching (Block 420) of the back side (FIG. 2, 205) and front side (FIG. 2, 210) of the thin-film stack (FIG. 1, 100) may be done separately. Therefore, the process may first emboss (Block 410) and then etch (Block 420) the front side (FIG. 2, 210) of the thin-film stack (FIG. 1, 100) and then continue with the embossing (Block 410) and etching (Block 420) the back side (FIG. 2, 205) of the thin-film stack (FIG. 1, 100).

Figure 5:
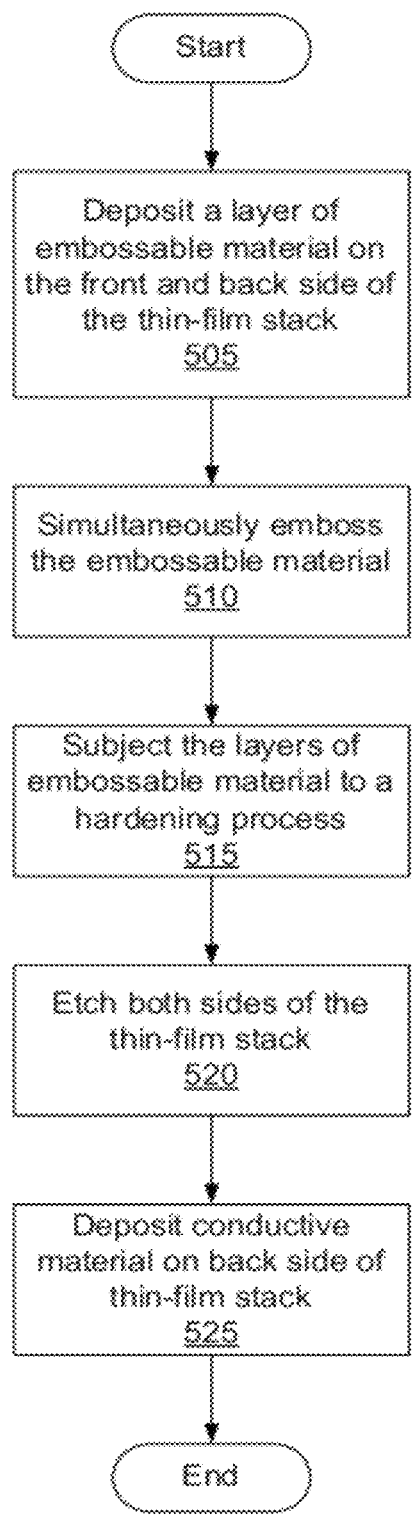
FIG. 5 is a flowchart describing another method of etching and embossing a thin-film stack according to one example of the principles described herein.

Turning now to FIG. 5, a flowchart describing another method of etching and embossing a thin-film stack according to one example of the principles described herein is shown.

Similar to the process described above in connection with FIG. 4, the process may begin with an embossable layer (FIG. 1, 105, 110) being deposited (Block 505) on both the front side (FIG. 2, 210) and back side (FIG. 2, 205) of a thin-film stack (100).

The embossable layers (FIG. 2, 105, 110) may then be embossed (Block 510) with a number of embossing tools (FIG. 2, 220, 230). During the embossing (Block 510), the embossing tools (FIG. 2, 220, 230) may transfer a pattern on either side (FIG. 2, 205, 210) of the thin-film stack (FIG. 1, 100). The patterns will be used later in the process to etch the thin-film stack (FIG. 1, 100) in such a way so as to properly form the various three-dimensional features on the front side (FIG. 2, 210) of the thin-film stack (FIG. 1, 100) as well as the vias through the back side (FIG. 2, 205) of the thin-film stack (FIG. 1, 100).

The embossable layers (FIG. 2, 105, 110) may then be subjected to a hardening process (Block 515) so that the embossable material is cured or at least semi-permanently solidified. Again, this may be done by, for example, subjecting the embossable layer (FIG. 1, 105, 110) to ultraviolet light or other radiation or subjecting the embossable layer (FIG. 1, 105, 110) to an amount of heat.

The thin-film stack (FIG. 1, 100) may then be subjected to an etching process (Block 520) similar to that described above in connection with FIGS. 3A-3G and 4. Then, as described above, after the thin-film stack (FIG. 1, 100) has been etched (Block 520) and the vias have been created through the various layers in the thin-film stack, a conductive material may be deposited (Block 525) on the back side (FIG. 2, 205) of the thin-film stack (FIG. 1, 100). In the example shown in FIGS. 3A-3G, after depositing the electrically conductive material on the back side (FIG. 2, 205) of the thin-film stack (FIG. 1, 100), the gate layer (120) and the source and drain layer (135) are electrically connected thereby forming a transistor.

The specification and figures describe a system method of etching through-substrate vias. Because both sides of the thin-film stack are embossed simultaneously, the various features embossed into the embossable material layers are transferred, by etching, into the thin-film stack and aligned correctly. Specifically, the features etched into the front side of the thin-film stack are properly aligned with a number of through-substrate vias etched into the back side of the thin-film stack.

Besides having through-substrate vias properly aligned with the three-dimensional features on the front of the thin-film stack, the method provides additional advantages. One advantage is that the method does not affect the interaction of a final layer passivation process of the thin-film stack with the patternability of that layer. Additionally, the method enables connections to a number of layers within the thin-film stack that cannot be accessed from the front of the thin-film stack due to the isolated nature of the layer. Still further, the process allows for a wider alignment tolerance as well as reduces any parasitic capacitance that may be experienced. Even further, the various embossable layers used to transfer the various patterns onto the thin-film stack may be used to balance the thin-film stack as it progresses through the various stages of production and specifically prevents excessive stress being exerted on the thin-film stack that can cause substrate deformation and cracking.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method of etching through-substrate vias comprising:
depositing a layer of embossable material on a first side and a second side of a thin-film stack, the thin-film stack including a base substrate;
embossing the embossable material deposited on the first side and the second side of the thin-film stack with a pattern;
hardening the embossable material; and
etching the first and second sides of the thin-film stack, the etching of the second side of the thin-film stack forming vias through the base substrate;
in which embossing the embossable material on the first and second sides of the thin-film stack is performed simultaneously.

2. The method of claim 1, wherein the thin-film stack comprises a first conductive layer, the first conductive layer being accessed from the second side of the thin-film stack by a through-substrate via.

3. The method of claim 2, wherein the thin-film stack further comprises a second conductive layer, the second conductive layer being accessed from the second side of the thin-film stack by a through-substrate via and electrically connected to the first conductive layer by a layer of conductive material deposited on the second side of the thin-film stack.

4. The method of claim 3, wherein the first conductive layer is a gate layer and the second conductive layer is a source and drain layer.

5. The method of claim 1, wherein hardening the embossable material comprises subjecting the embossable material to an ultraviolet light source.

6. The method of claim 1, wherein hardening the embossable material comprises subjecting the embossable material to an amount of heat.

7. The method of claim 1, wherein etching the first and second sides of the thin-film stack is performed by a wet etching, dry etching, or combinations thereof.

8. The method of claim 1, wherein etching the first and second sides of the thin-film stack is performed at different times.

9. A method of etching through-substrate vias comprising:
depositing a layer of embossable material on a first side and a second side of a thin-film stack;
embossing the embossable material deposited on the first side and the second side of the thin-film stack with a three-dimensional pattern;
hardening the embossable material;
etching the first and second sides of the thin-film stack, the etching of the second side of the thin-film stack forming vias through the base substrate; and
depositing a conductive material on the back side of the thin film stack;
in which depositing a conductive material on the back side of the thin film stack electrically connects a number of conductive layers within the thin-film stack; the conductive layers comprising gate layer, a source layer, and a drain layer.

* * * * *